United States Patent [19]
Lennon

[11] 4,074,201
[45] Feb. 14, 1978

[54] SIGNAL ANALYZER WITH NOISE ESTIMATION AND SIGNAL TO NOISE READOUT

[75] Inventor: Thomas J. Lennon, Burlington, Mass.

[73] Assignee: GTE Sylvania Incorporated, Stamford, Conn.

[21] Appl. No.: 708,369

[22] Filed: July 26, 1976

[51] Int. Cl.² ........................................... H04B 17/00
[52] U.S. Cl. .................................. 325/363; 324/57 N
[58] Field of Search ................... 325/65, 67, 304, 305, 325/363, 473, 475, 476, 38 B; 324/57 R, 57 N; 328/115, 165, 162; 307/235 F, 235 G; 340/347 CC

[56] References Cited

U.S. PATENT DOCUMENTS 3,189,891  6/1965  Karsh ............................ 340/347 CC

OTHER PUBLICATIONS

"Adaptive Delta Modulator with Variable"–Sample Rate–Jones, et al., Mar. 1973, vol. 15, No. 10–IBM Technical Disclosure Bulletin, pp. 3168–3169.

Primary Examiner—Robert L. Griffin
Assistant Examiner—Marc E. Bookbinder
Attorney, Agent, or Firm—David M. Keay

[57] ABSTRACT

Signal monitoring apparatus in which a baseband signal including noise is compared at timed intervals with a reference signal and an estimated noise signal from an estimated noise signal generator. Indications of whether the estimated noise signal is higher or lower than the noise level present in the signal are applied to a digital accumulator in the estimated noise signal generator. Certain of the most significant bits in the accumulator are employed to generate the analog estimated noise signal. An arrangement for preventing or permitting the passage of indications to the accumulator approximates the Rayleigh distribution of differential error probabilities about the estimated noise signal being generated. The result is that the estimated noise signal is an rms value averaged over a large number of measurements. Certain of the most significant bits in the accumulator are decoded and converted to an analog voltage which is a measure of the signal-to-noise power ratio of the baseband signal.

15 Claims, 4 Drawing Figures

FIG. 3

| $E_{RMS}$ | $\log_{10} SNR(50) + 34$ | OUTPUT VOLTAGE ($10 \log_{10} SNR$) |
|---|---|---|
| 1 | 172 | 6.9 V |
| 2 | 156 | 6.2 V |
| 3 | 140 | 5.6 V |
| 4 | 124 | 5.0 V |
| 5 | 116 | 4.6 V |
| 6 | 108 | 4.3 V |
| 7 | 100 | 4.0 V |
| 8 | 92 | 3.7 V |
| 9 | 88 | 3.5 V |
| 10 | 84 | 3.35 V |
| 11 | 80 | 3.2 V |
| 12 | 76 | 3.05 V |
| 13 | 72 | 2.9 V |
| 14 | 68 | 2.7 V |
| 15 | 64 | 2.55 V |
| 16 | 60 | 2.4 V |
| 17 | 56 | 2.25 V |
| 18 | 52 | 2.1 V |
| 19 | 48 | 1.9 V |
| 20 | 44 | 1.75 V |
| 21 | 40 | 1.6 V |
| 22 | 36 | 1.45 V |
| 23 | 32 | 1.3 V |
| 24 | 28 | 1.1 V |

SIGNAL ANALYZER WITH NOISE ESTIMATION AND SIGNAL TO NOISE READOUT

BACKGROUND OF THE INVENTION

This invention relates to communication equipment. More particularly, it is concerned with signal monitoring apparatus for determining the noise present in received signals.

There are many known techniques for measuring the noise present in received signals and for determining the signal-to-noise power ratio. Although these techniques are satisfactory for certain applications, many of them provide limited resolution, are difficult to calibrate accurately, and are susceptible to drifting. In addition, there are difficulties involved in employing known techniques to obtain averaged or rms measurements of the noise present.

SUMMARY OF THE INVENTION

Improved signal monitoring apparatus in accordance with the present invention provides for accurate, drift-free measurement of the noise present in a received signal. The apparatus produces a difference signal which is an average of a large number of instantaneous differences measured between a received signal and a reference signal. The apparatus includes a difference signal means for producing a difference signal which is an averaged estimate of the noise present in the received signal. The difference signal is determined by accumulated data contained within the difference signal means. An analyzing means is coupled to the difference signal means and produces a first indication if the received signal is greater than the sum of the reference signal and the difference signal; that is if the difference signal is too low. The analyzing means produces a second indication if the received signal is less than the sum of the reference signal and the difference signal; that is if the difference signal is too high. In response to a first indication from the analyzing means the accumulated data contained in the difference signal means is altered in a manner tending to cause an increase in the difference signal produced; and in response to a second indication from the analyzing means the accumulated data in the difference signal means is altered in a manner tending to cause a decrease in the difference signal produced.

BRIEF DESCRIPTION OF THE DRAWINGS

Additional objects, features, and advantages of signal monitoring apparatus in accordance with the present invention will be apparent from the following detailed discussion together with the accompanying drawings wherein:

FIG. 3 is a table of relationships between the values of the signals at various points in a specific embodiment of the apparatus of FIG. 1.

Standard well-known symbols and notations are employed throughout the drawings to designate the various logic components.

DETAILED DESCRIPTION OF THE INVENTION

Figure 1:
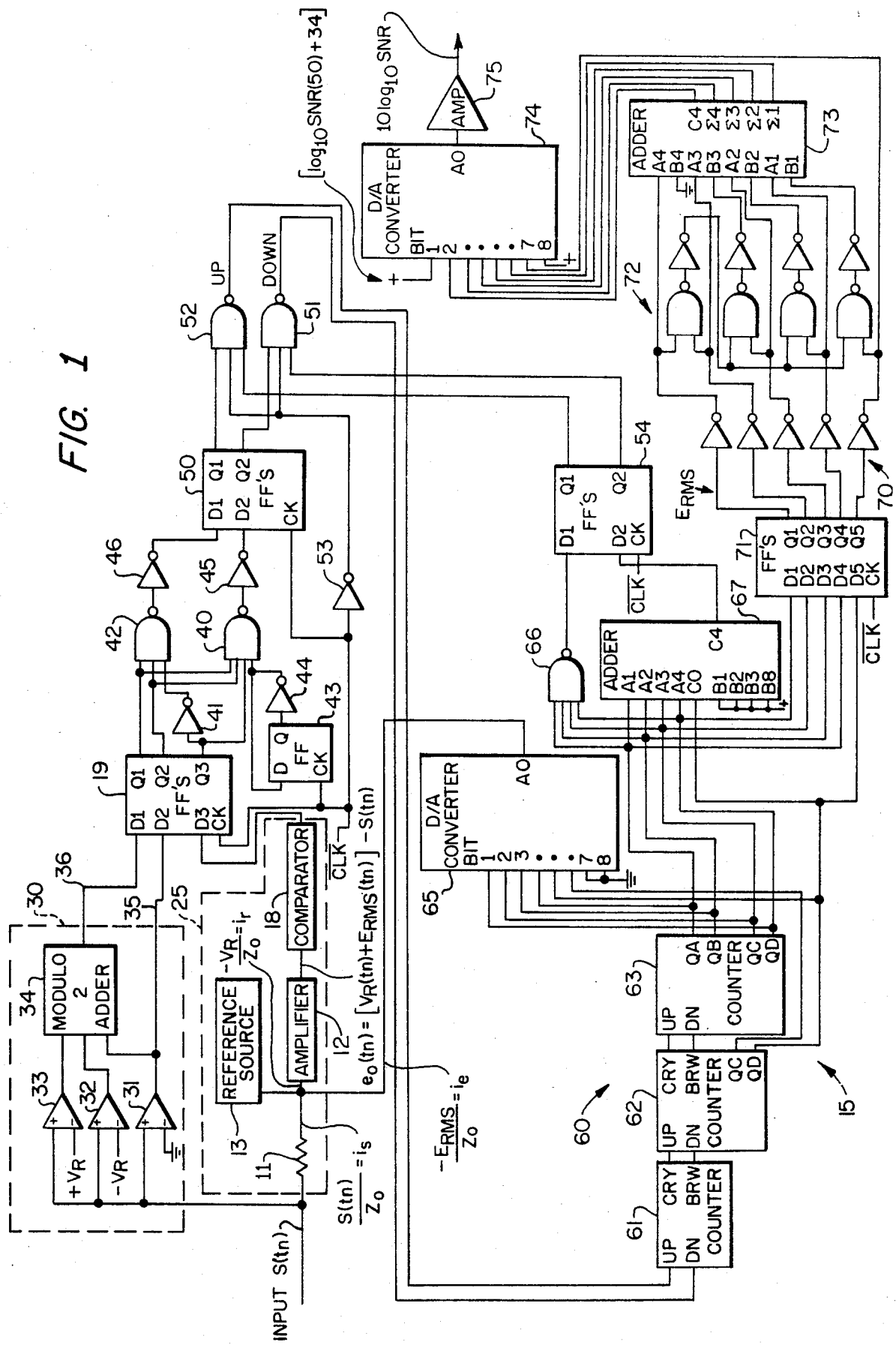
FIG. 1 is a logic diagram of signal monitoring apparatus in accordance with the present invention.

A baseband signal $S(tn)$ which includes noise is applied to the input of signal monitoring apparatus in accordance with the present invention as illustrated in FIG. 1. In the specific embodiment under discussion the baud rate of the received signal is 5 MHz and the voltage level of the signal without noise is 1.5 volts. The received input signal is applied by way of a resistance 11 to a wideband operational amplifier 12. The resistance converts the signal to a current component $i_s$ equivalent to the applied signal divided by an impedance $(S(tn)/Z_o)$. A reference source 13 produces a reference current $i_r$ which is also applied to the amplifier 12. This current is equivalent to a negative reference voltage divided by the same impedance $(-V_R/Z_o)$. The reference voltage $V_R$ is equal to the incoming signal level of the incoming signal minus noise, 1.5 volts in the specific embodiment under discussion. A third current $i_e$ is applied to the amplifier 12 from an estimated noise signal generator 15. This current is equivalent to the negative of an estimated noise signal divided by the same impedance $(-E_{RMS}/Z_o)$ and is produced by the estimated noise signal generator as will be explained hereinbelow.

The amplifier 12 produces an output voltage $e_o(tn)$ which is the instantaneous error between the estimated noise signal from the estimated noise signal generator 15 and the actual noise level present in the instantaneous received signal $S(tn)$. This relationship may be expressed as:

$$e_o(tn) = [V_R(tn) + E_{RMS}(tn)] - S(tn)$$

The output signal from the amplifier 12 is applied to a wideband comparator 18 which produces a logic 1 if the error signal $e_o(tn)$ is positive indicating that the actual noise present is less than the estimated noise and a logic 0 if the error signal $e_o(tn)$ is negative indicating that the actual noise present is greater than the estimated noise. This data is stored in one of a set of flip-flops 19 on a $\overline{CLK}$ clock pulse. The $\overline{CLK}$ clock pulses are at the baud rate and thus the incoming signal is sampled for noise once every baud.

Figure 2:
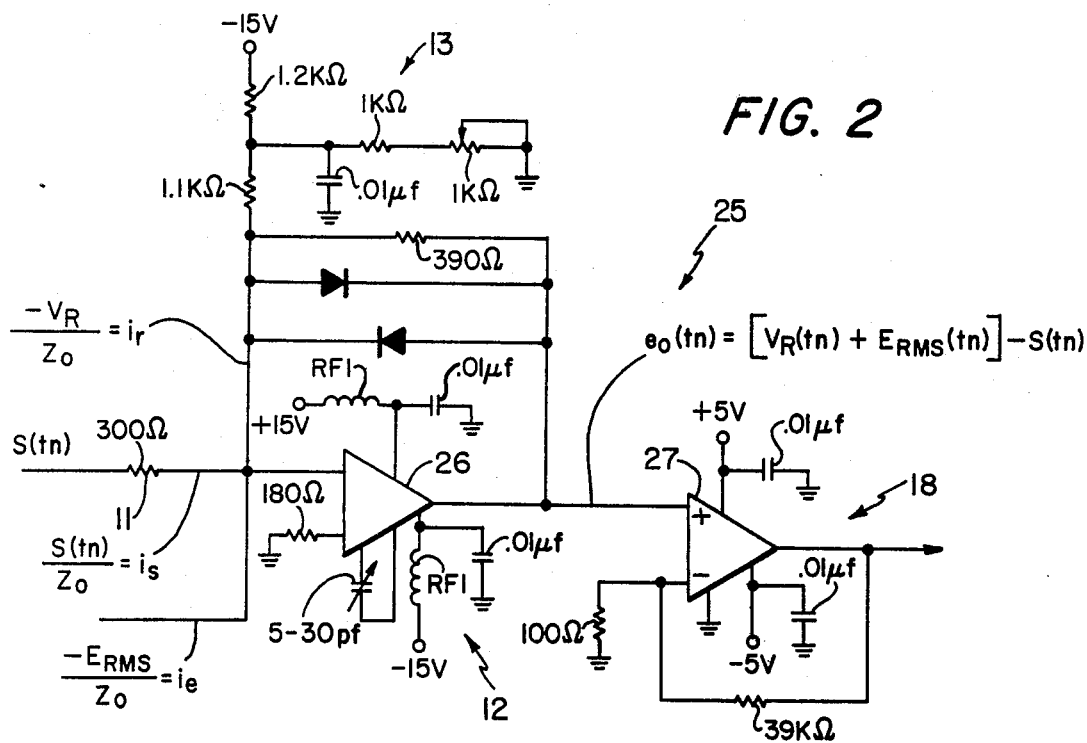
FIG. 2 is a detailed circuit diagram of a portion of a specific embodiment of the apparatus of FIG. 1.

A detailed schematic circuit diagram of the resistance 11, reference source 13, amplifier 12, and comparator 18 which are enclosed within the dashed lines 25 is shown in FIG. 2. The specific circuit shown in FIG. 2 employs a commercially available type LH0032 wideband operational amplifier 26 and a commercially available type 760 wideband comparator 27. These elements together with circuit components of the value as shown in FIG. 2 provide a specific embodiment for use with incoming signals of 1.5 volts at a 5 MHz rate.

FIG. 1 shows a portion 30 of the demodulator of receiving equipment with which the signal monitoring apparatus of the invention is associated. As shown schematically in FIG. 1 the received signal $S(tn)$ is compared to three voltage levels. Comparator 31 compares the received signal to ground, comparator 32 compares the received signal to the negative value of the reference voltage $(-V_R)$, and comparator 33 compares the received signal to the positive value of the reference voltage $(+V_R)$. The outputs of the comparators are applied to a modulo-2 adder 34. A logic 1 is produced on the output line 35 from comparator 31 when the received signal $S(tn)$ is positive and a logic 1 is produced on the output line 36 from the modulo-2 adder 34 when the noise level in the received signal is positive. This data is also clocked into flip-flops 19 on a CLK clock pulse, and is employed to enable or inhibit the apparatus from utilizing the corresponding sample as will be explained hereinbelow. The foregoing arrangement 30 is employed in conjunction with the specific embodiment shown to insure that only signal samples in which both the signal and the noise are of positive polarity are utilized as will be explained hereinbelow. This arrangement is not an essential feature of the invention, however, and other techniques may be employed to disregard unwanted samples.

The data from the comparator 18 which is stored in one of flip-flops 19 is applied directly to a NAND gate 40 and by way of an inverter 41 to another NAND gate 42. The data from the portion of the demodulator 30 which are stored in flip-flops 19 are also applied to NAND gates 40 and 42 as enabling or inhibiting signals. NAND gates 40 and 42 are enabled only when outputs Q1 and Q2 of flip-flops 19 are both logic 1. The NAND gate 40 also has an input from a combination of a flip-flop 43 and an inverter 44 connected as shown in FIG. 1 and clocked by $\overline{CLK}$ clock pulses. This arrangement permits NAND gate 40 to be enabled only for every other sample.

The purpose of the flip-flop 43 and inverter 44 is to take into consideration that the differential error probabilities about the estimated noise signal being generated have a Rayleigh distribution. That is, the mean value of the error signal has a 38% probability of being above the rms value of the noise signal and a 62% probability of being below. By enabling the NAND gate 40 for only half the samples the Rayleigh distribution ratio of 38 to 62 is approximated sufficiently so that the apparatus produces an estimated noise signal which is more nearly a true rms value rather than a mean value.

The outputs of the NAND gates 40 and 42 are applied through inverters 45 and 46, respectively, to a set of flip-flops 50 which are also clocked by $\overline{CLK}$ clock pulses. The outputs of the flip-flops 50 are applied to NAND gates 51 and 52. The NAND gates 51 and 52 are enabled on CLK clock pulses applied through an inverter 53. The NAND gates 51 and 52 are normally enabled by logic 1 signals from flip-flops 54. When the NAND gates 51 and 52 are clocked on a CLK clock pulse if a logic 1 is stored in either of the flip-flops 50, a corresponding DOWN or UP signal is produced by the appropriate gate 51 or 52. UP and DOWN signals are applied to an accumulator 60 in the estimated noise signal generator 15. The accumulator 60 includes three 4-bit up/down counters 61, 62, and 63 connected in series as shown in FIG. 1. An UP signal from NAND gate 52 increases the count in the accumulator 60 by one, and a DOWN signal from NAND gate 51 decreases the accumulated count by one. The six most significant bits of the contents of the accumulator are applied to a digital-to-analog converter 65. The output of the digital-to-analog converter 65 is the current $i_e$ which is the estimated noise signal applied to the amplifier 12.

The four most significant bits of the count in the accumulator 60 are also applied to a NAND gate 66 which has its output connected to the D1 input of flip-flops 54. The NAND gate 66 produces a logic 0 when all of its inputs are logic 1 indicating that the four bits of the estimated noise signal are at their highest level. The Q1 output of the flip-flop becomes a logic 0 on the next $\overline{CLK}$ clock pulse inhibiting NAND gate 52 from passing any more UP signals. Thus, the accumulator 60 is prevented from counting over a maximum predetermined value.

The five most significant bits are also applied to the A and C0 inputs of an adder 67 as shown in FIG. 1. All of the B inputs are at a logic 1 level. The C4 output of the adder, which is the carry output, produces a logic 0 when the five most significant bits in the accumulator 60 are logic 0. This output signal is applied to the D2 input of flip-flops 54 and when stored therein become an inhibit signal to NAND gate 51 preventing the passage of DOWN signals to the accumulator 60. Thus, the accumulator is prevented from counting below a minimum predetermined value.

The five most significant bits in the accumulator 60 are applied to a signal-to-noise readout section 70. They are clocked into a set of flip-flops 71 on each $\overline{CLK}$ clock pulse. The outputs of the flip-flops are applied to a logic arrangement including an array 72 of NAND gates and inverters and an adder 73 connected as shown in FIG. 1. The digital output of the logic arrangement is connected to a digital-to-analog converter 74 as shown, and the analog output of the digital-to-analog converter is amplified by an amplifier 75 to provide an output voltage which is linearly related to an rms average signal-to-noise power ratio of the baseband signal.

Figure 4:
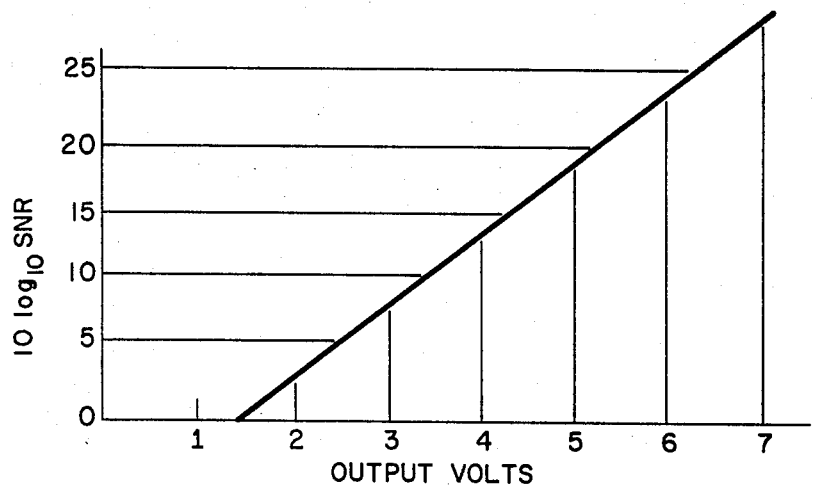
FIG. 4 is a graph indicating the relationships between the output signal and the signal-to-noise power ratio of the received signal in a specific embodiment of the apparatus of FIG. 1.

The relationship between the rms noise signal $E_{RMS}$ and the signal-to-noise power ratio SNR may be expressed as $SNR = (V_R^2 - E_{RMS}^2)/E_{RMS}^2$. The readout section 70 converts the digital value of the noise signal $E_{RMS}$ stored in the flip-flops 71 as listed in the first column of the table of FIG. 3 to a corresponding output voltage as listed in the third column. The output voltage is linearly proportional to $10 \log_{10} SNR$ as shown in the graph of FIG. 4. In the specific embodiment under discussion the reference voltage $V_R$ is assigned a digital value of 32 for computational purposes and the array of logic elements 72 and adder 73 produce a digital value of $[\log_{10}SNR(50) + 34]$ as listed in the second column of the table of FIG. 3. The values of 50 and 34 are also chosen for ease in computation. In the specific embodiment the analog output of the digital-to-analog converter 74 is amplified by amplifier 75 to provide corresponding voltage values as listed in the third column of the table and which translate to a value of $10 \log_{10} SNR$ in accordance with the graph of FIG. 4.

In summary, the apparatus as shown and described produces an estimated rms noise signal which is an average derived from data accumulated over a large number of measurements and updated on each measurement. The noise signal is employed to provide an average of the signal-to-noise power ratio of the baseband signal. In the apparatus each baseband received signal $S(tn)$ is converted to a current $i_s$ and combined with a reference current $i_r$ and an estimated noise current $i_e$ by the amplifier 12. The amplifier 12 produces an output $$e_o(tn) = [V_R(tn) + E_{RMS}(tn)] - S(tn)$$

which is positive if the estimated noise signal is too high and negative if the estimated noise signal is too low. The comparator 18 produces a logic 1 if the output of the amplifier is positive and a logic 0 if it is negative. On the CLK clock pulse occurring when the baseband signal is present the output of the comparator 18 is placed in flip-flops 19 at the D3 input. Corresponding enabling signals on lines 35 and 36 are loaded at the D2 and D1 inputs if the baseband signal is positive and if the noise level is positive.

The Q3 output of flip-flops 19 is applied directly to NAND gates 40 and also inverted and applied to NAND gate 42. Assuming the presence of logic 1 enabling signals from the Q1 and Q2 outputs of the flip-flops 19 if the estimated noise signal was low, NAND gate 42 produces a signal which is applied to the D1 input of flip-flops 50 and stored as a logic 1 on the next $\overline{\text{CLK}}$ clock pulse. If the estimated noise signal was high, the logic 1 at the Q3 output of flip-flop 19 is applied to NAND gate 40. As explained previously the arrangement of flip-flop 43 and inverter 44 enables and inhibits NAND gate 40 during alternate sample periods. If the proper enabling signals are present, a logic 1 at the Q3 output of flip-flops 19 causes a logic 1 to be applied at the D2 input of flip-flop 50 and to be stored therein on the subsequent $\overline{\text{CLK}}$ clock pulse. If either the Q1 or the Q2 output of flip-flops 50 is a logic 1, then on the next $\overline{\text{CLK}}$ clock pulse an UP or DOWN signal pulse is produced by NAND gate 52 or 51 and applied to the accumulator 60. Thus, the contents of the accumulator 60 are altered in a direction tending to cause the output of the estimated noise signal generator to increase or decrease. Since only the six most significant bits of the count in the accumulator 60 are employed in producing the estimated noise signal, however, a large number of sample measurements are required to produce a change in the value of the estimated noise signal.

While there has been shown and described what is considered a preferred embodiment of the present invention, it will be obvious to those skilled in the art that various changes and modifications may be made therein without departing from the invention as defined by the appended claims.

What is claimed is:

1. Signal analyzing apparatus for producing an estimated noise signal which is an average of differences between a received signal corrupted by additive noise and a reference signal which is equal to the received signal without additive noise, said apparatus including in combination an input connection for receiving a received signal corrupted by additive noise, reference signal means for producing a fixed reference signal equal to the received signal without additive noise;

estimated noise signal means for accumulating data and for producing an estimated noise signal determined by the accumulated data contained therein, and analyzing means coupled to said input connection, said signal means, and said estimated noise signal means for producing a first indication if the received signal is greater than the algebraic sum of the reference signal and the estimated noise signal and for producing a second indication if the received signal is less than the algebraic sum of the reference signal and the estimated noise signal;

said estimated noise signal means being operable in response to a first indication from said analyzing means to alter the accumulated data contained in the estimated noise signal means in a manner tending to cause an increase in the estimated noise signal produced, and being operable in response to a second indication from said analyzing means to alter the accumulated data contained in the estimated noise signal means in a manner tending to cause a decrease in the estimated noise signal produced.

2. Signal analyzing apparatus in accordance with claim 1 wherein said analyzing means includes combining means for receiving the received signal, reference signal, and estimated noise signal and for producing an output signal related to the difference between the received signal and the algebraic sum of the reference and estimated noise signals;

comparator means coupled to the combining means for producing an output signal at a first level in response to an output signal from the combining means indicating that the received signal is greater than the algebraic sum of the reference and estimated noise signals and for producing an output signal at a second level in response to an output signal from the combining means indicating that the received signal is less than the algebraic sum of the reference and estimated noise signals; and logic means for producing said first indication in response to an output signal at the first level from the comparator means and for producing said second indication in response to an output signal at the second level from the comparator means.

3. Signal analyzing apparatus in accordance with claim 2 wherein said estimated noise signal means is operable to produce an estimated noise signal related to the most significant portions of the accumulated data contained in the estimated noise signal means, and is operable to alter the accumulated data in response to each indication from said analyzing means by an increment which is less significant than said most significant portions.

4. Signal analyzing apparatus in accordance with claim 1 including timing means for causing said analyzing means to produce a plurality of first and second indications at timed intervals;

and wherein said estimated noise signal means includes accumulator means for counting said first indications in a first direction and said second indications in the opposite direction to produce an accumulated count representing an estimated noise signal, and converting means coupled to the accumulator means for converting the accumulated count in the accumulator means to an analog estimated noise signal.

5. Signal analyzing apparatus in accordance with claim 4 wherein said analyzing means includes combining means for receiving the received signal, reference signal, and estimated noise signal and for producing an output signal related to the difference between the received signal and the algebraic sum of the reference and estimated noise signals;

comparator means coupled to the combining means for producing an output signal at a first level in response to an output signal from the combining means indicating that the received signal is greater than the algebraic sum of the reference and estimated noise signals and for producing an output signal at a second level in response to an output signal from the combining means indicating that the received signal is less than the algebraic sum of the reference and estimated noise signals; and logic means for producing said first indication in response to an output signal at the first level from the comparator means and for producing said second indication in response to an output signal at the second level from the comparator means.

6. Signal analyzing apparatus in accordance with claim 5 wherein
said converting means is operable in response to a predetermined number of the most significant bits of the accumulated count in the accumulator means to produce the analog estimated noise signal.

7. Signal analyzing apparatus in accordance with claim 6 wherein said analyzing means includes
selection means for gating indications from said analyzing means to said estimated noise signal means in a predetermined gating pattern.

8. Signal analyzing apparatus in accordance with claim 7 including
means coupled to said accumulator means for preventing said accumulator means from counting beyond a first predetermined accumulated count in the first direction and beyond a second predetermined accumulated count in the opposite direction.

9. Signal monitoring apparatus for measuring an average signal-to-noise power ratio of a received signal corrupted by additive noise including in combination
an input connection for receiving a received signal corrupted by additive noise,
reference signal means for producing a fixed reference signal equal to the received signal without additive noise;
estimated noise signal means for accumulating data and for producing an estimated noise signal determined by the accumulated data contained therein;
analyzing means coupled to said input connection, said reference signal means, and said estimated noise signal means for producing a first indication if the received signal is greater than the algebraic sum of the reference signal and the estimated noise signal and for producing a second indication if the received signal is less than the algebraic sum of the reference signal and the estimated noise signal;
said estimated noise signal means being operable in response to a first indication from said analyzing means to alter the accumulated data contained in the estimated noise signal means in a manner tending to cause an increase in the estimated noise signal produced, and being operable in response to a second indication from said analyzing means to alter the accumulated data contained in the estimated noise signal means in a manner tending to cause a decrease in the estimated noise signal produced; and
readout means coupled to the estimated noise signal means for producing an output signal indicating the power ratio of the reference signal to said estimated noise signal.

10. Signal monitoring apparatus in accordance with claim 9 wherein said analyzing means includes
combining means for receiving the received signal, reference signal, and estimated noise signal and for producing an output signal related to the difference between the received signal and the algebraic sum of the reference and estimated noise signals;
comparator means coupled to the combining means for producing an output signal at a first level in response to an output signal from the combining means indicating that the received signal is greater than the algebraic sum of the reference and estimated noise signals and for producing an output signal at a second level in response to an output signal from the combining means indicating that the received signal is less than the algebraic sum of the reference and estimated noise signals; and
logic means for producing said first indication in response to an output signal at the first level from the comparator means and for producing said second indication in response to an output signal at the second level from the comparator means.

11. Signal monitoring apparatus in accordance with claim 9 including
timing means for causing said analyzing means to produce a plurality of first and second indications at timed intervals;
and wherein
said estimated noise signal means includes
accumulator means for counting said first indications in a first direction and said second indications in the opposite direction to produce an accumulated count representing an estimated noise signal, and
converting means coupled to the accumulator means for converting the accumulated count in the accumulator means to an analog estimated noise signal;
said readout means includes
readout logic means coupled to the accumulator means for producing a digital output signal proportional to the logarithm of the signal-to-noise power ratio of the reference signal and the accumulated count in the accumulator means representing the estimated noise signal, and
readout converting means coupled to the readout logic means for converting the digital output signal to an analog output signal proportional to the signal-to-noise power ratio of the reference signal and the estimated noise signal.

12. Signal monitoring apparatus in accordance with claim 11 wherein said analyzing means includes
combining means for receiving the received signal, reference signal, and estimated noise signal and for producing an output signal related to the difference between the received signal and the algebraic sum of the reference and estimated noise signals;
comparator means coupled to the combining means for producing an output signal at a first level in response to an output signal from the combining means indicating that the received signal is greater than the algebraic sum of the reference and estimated noise signals and for producing an output signal at a second level in response to an output signal from the combining means indicating that the received signal is less than the algebraic sum of the reference and estimated noise signals; and
logic means for producing said first indication in response to an output signal at the first level from the comparator means and for producing said second indication in response to an output signal at the second level from the comparator means.

13. Signal monitoring apparatus in accordance with claim 12 wherein
said converting means is operable in response to a predetermined number of the most significant bits of the accumulated count in the accumulator means to produce the analog estimated noise signal.

14. Signal monitoring apparatus in accordance with claim 13 wherein said analyzing means includes selection means for gating indications from said analyzing means to said estimated noise signal means in a predetermined gating pattern.

15. Signal monitoring apparatus in accordance with claim 14 including
means coupled to said accumulator means for preventing said accumulator means from counting beyond a first predetermined accumulated count in the first direction and beyond a second predetermined accumulated count in the opposite direction.

* * * * *